United States Patent

Steiner et al.

(10) Patent No.: US 11,674,856 B2
(45) Date of Patent: Jun. 13, 2023

(54) SYSTEM AND METHOD FOR ESTIMATING JUNCTION TEMPERATURES OF A POWER SEMICONDUCTOR MODULE

(71) Applicant: Airbus (S.A.S.), Blagnac (FR)

(72) Inventors: Gerhard Steiner, Mindelheim (DE); Florian Kapaun, Kirchseeon (DE)

(73) Assignee: Airbus (S.A.S.), Blagnac (FR)

( * ) Notice: Subject to any disclaimer, the term of this patent is extended or adjusted under 35 U.S.C. 154(b) by 135 days.

(21) Appl. No.: 17/229,358

(22) Filed: Apr. 13, 2021

(65) Prior Publication Data

US 2021/0325257 A1 Oct. 21, 2021

(30) Foreign Application Priority Data

Apr. 15, 2020 (DE) ................... 10 2020 204 771.5

(51) Int. Cl.
*G01K 7/01* (2006.01)
*H01L 23/34* (2006.01)

(52) U.S. Cl.
CPC .............. *G01K 7/01* (2013.01); *H01L 23/34* (2013.01)

(58) Field of Classification Search
USPC ......................................................... 374/178
See application file for complete search history.

(56) References Cited

U.S. PATENT DOCUMENTS

| 7,332,358 | B2 | 2/2008 | Orr | |
|---|---|---|---|---|
| 2006/0221527 | A1* | 10/2006 | Jacobson | G01K 7/42 374/E7.042 |
| 2021/0325258 | A1* | 10/2021 | Kapaun | G01R 31/2628 |
| 2021/0396596 | A1* | 12/2021 | Akin | G01K 7/01 |
| 2022/0018720 | A1* | 1/2022 | Tulane | G01K 7/22 |

FOREIGN PATENT DOCUMENTS

| CN | 109994993 A | * | 7/2019 | ............... G01K 1/08 |
|---|---|---|---|---|
| DE | 38 32 273 A1 | | 3/1990 | |
| DE | 10 2011 050 122 A1 | | 6/2012 | |
| DE | 10 2013 218 909 A1 | | 3/2015 | |
| DE | 10 2016 207 326 A1 | | 11/2016 | |
| EP | 3208586 A1 | * | 8/2017 | ............ G01K 13/00 |
| EP | 3 627 702 A1 | | 3/2020 | |
| GB | 2 574 941 A | | 12/2019 | |

OTHER PUBLICATIONS

German Search Report for Application No. 10 2020 204 771.5 dated Jan. 27, 2021.
German Search Report for Application No. 10 2020 204 769.3 dated Jan. 27, 2021.

* cited by examiner

*Primary Examiner* — Mirellys Jagan
(74) *Attorney, Agent, or Firm* — KDW Firm PLLC

(57) ABSTRACT

A system for estimating junction temperatures of a power semiconductor module includes a constant current source to apply constant drain current to a drain terminal of a power semiconductor device, an adjustable gate voltage source to apply a gate voltage signal to a gate terminal, a drain-source voltage sensor between the drain terminal and the source terminal and configured to measure a value of the current drain-source voltage across the power semiconductor device and output a corresponding drain-source voltage signal, a gate controller to determine a difference between the drain-source voltage signal and a constant reference voltage and control output of the adjustable gate voltage source dependent on the determined difference, and a system controller to switch the power semiconductor device to its fully conducting state and to estimate junction temperature within the power semiconductor device in dependency from the on-state resistance in the fully conducting state.

16 Claims, 2 Drawing Sheets

SYSTEM AND METHOD FOR ESTIMATING JUNCTION TEMPERATURES OF A POWER SEMICONDUCTOR MODULE

CROSS-REFERENCE TO RELATED APPLICATION

This application claims priority to German Patent Application Serial No. 102020204771.5 filed Apr. 15, 2020, the entire disclosure of which is incorporated by reference herein.

TECHNICAL FIELD

The present disclosure relates to systems and methods for determining the thermal resistance of a power semiconductor, particularly for use in a method of estimating junction temperatures of a power semiconductor module in use by thermally sensitive electrical parameters.

Although applicable for any kind of power semiconductor, the disclosure herein and the corresponding underlying problems will be explained in further detail in conjunction with field-effect transistors. Power semiconductor devices within the meaning of the present disclosure involve any semiconductor device used as a switch or rectifier in power electronics. Power semiconductor devices may in particular comprise silicon-controlled rectifiers, semiconductor thyristors, triacs, bipolar junction transistors (BJTs), metal-oxide semiconductor field-effect transistors (MOSFETs), insulated gate bipolar transistors (IGBTs), MOS-controlled thyristors, integrated gate-commutated thyristors (IGCTs) and similar devices. Power semiconductor device within the meaning of the present disclosure may for example be based on standard silicon technology, gallium arsenide, gallium nitride or silicon carbide technology.

BACKGROUND

Power electronics use power semiconductor devices that transfer heat to the surroundings during use. The heat transfer capability under varying operational parameters has a great impact on the design and performance of power electronics including such power semiconductor devices. It is therefore important to be able to determine characteristic parameters of such heat transfer capabilities in order to plan and design power electronics equipment properly.

To measure the heat transfer capability of a semiconductor device it is necessary to generate a constant and definable energy loss rate within the semiconductor device. In this case, the heat transfer capability of the semiconductor device may be determined by measuring the local temperatures on various locations, such as heat sink, chip, mounting structure or die bonds.

Generating a predictable heat energy loss rate conventionally involves supplying a gate-source voltage in the linear operation regime of the power semiconductor device or feeding the power semiconductor device with a predefined amount of power from a known power supply. Examples for such an approach are given in document GB 2 574 941 A. Document DE 10 2011 050 122 A1 discloses a method for junction temperature measurement in a power MOSFET. Document U.S. Pat. No. 7,332,358 B2 discloses a method for sensing the temperature of a MOSFET junction while it is conducting a controlled drain current.

Additionally, making use of thermally sensitive electrical parameters for estimating heat transfer capabilities usually requires measurements of die temperatures from the outside, such as with an infrared camera or a temperature sensor close to the die. As most advanced devices are encapsulated and housed in integrated housings, thermal characterization usually involves partially or wholly undoing the encapsulation to make the die accessible to the temperature measurement equipment, which in turn renders the semiconductor device inoperable or destroyed.

SUMMARY

It is one of the objects of the disclosure herein to find solutions for a more efficient and more accurate, yet simpler process to determine heat transfer capabilities of a power semiconductor device. Another of the objects of the disclosure herein is to find solutions for thermally characterizing power semiconductor modules that enable a determination of junction temperatures in use without the need to open existing module housings.

According to a first aspect of the disclosure herein a system for determining the thermal resistance of a power semiconductor comprises a constant current source configured to apply a constant drain current to a drain terminal of the power semiconductor device, an adjustable gate voltage source configured to apply a gate voltage signal to a gate terminal of the power semiconductor device, a drain-source voltage sensor coupled between the drain terminal and the source terminal, the drain-source voltage sensor being configured to measure a value of the current drain-source voltage across the power semiconductor device and to output a corresponding drain-source voltage signal, a gate controller configured to determine a difference between the drain-source voltage signal and a constant reference voltage and to control the output of the adjustable gate voltage source dependent on the determined difference, and a system controller configured to determine a thermal resistance of the power semiconductor device on the basis of the applied drain current and the measured drain-source voltage.

According to a second aspect of the disclosure herein a method for determining the thermal resistance of a power semiconductor includes the steps of applying a constant drain current to a drain terminal of the power semiconductor device, applying a gate voltage signal to a gate terminal of the power semiconductor device, measuring a current drain-source voltage across the power semiconductor device and determining a difference between the current drain-source voltage and a constant reference voltage, controlling the gate voltage signal dependent on the determined difference in order to minimize the determined difference, and determining a thermal resistance of the power semiconductor device on the basis of the applied drain current and the measured drain-source voltage.

According to a third aspect of the disclosure herein a system for estimating junction temperatures of a power semiconductor module comprises a constant current source configured to apply a constant drain current to a drain terminal of a power semiconductor device of the power semiconductor module, an adjustable gate voltage source configured to apply a gate voltage signal to a gate terminal of the power semiconductor device, a drain-source voltage sensor coupled between the drain terminal and the source terminal, the drain-source voltage sensor being configured to measure a value of the current drain-source voltage across the power semiconductor device and to output a corresponding drain-source voltage signal, a gate controller configured to determine a difference between the drain-source voltage signal and a constant reference voltage and to control the output of the adjustable gate voltage source dependent on the determined difference, and a system controller configured to switch the power semiconductor device to its fully conducting state when the deviations in the gate-source voltage over time remain within a tolerance band and to estimate the junction temperature within the power semiconductor device on the basis of the on-state resistance of the power semiconductor device in the fully conducting state.

According to a fourth aspect of the disclosure herein a method for estimating junction temperatures of a power semiconductor module includes the steps of includes the steps of applying a constant drain current to a drain terminal of a power semiconductor device of the power semiconductor module, applying a gate voltage signal to a gate terminal of the power semiconductor device, measuring a current drain-source voltage across the power semiconductor device and determining a difference between the current drain-source voltage and a constant reference voltage, controlling the gate voltage signal dependent on the determined difference in order to minimize the determined difference, measuring deviations of the values of the gate-source voltage across the power semiconductor device over time, switching the power semiconductor device to its fully conducting state when the deviations in the measured values of the gate-source voltage over time remain within a tolerance band, and estimating the junction temperature within the power semiconductor device on the basis of the on-state resistance of the power semiconductor device in the fully conducting state.

One idea of the disclosure herein is to control the heat energy loss rate in a power semiconductor device by adjusting an applied gate-source voltage based on changes of the drain-source voltage over time due to increasing junction temperatures within the power semiconductor device. In other words, any temperature induced drain-source voltage change will be compensated for by a drain-source voltage change induced by a change of the voltage applied to the gate of the power semiconductor device. When the drain current is held constant by a constant current source, the drain-source voltage may equally be stabilized at a constant value irrespective of any temperature changes during operation of the power semiconductor device. This allows to adjust the heat energy introduced into the power semiconductor device at a desired defined level so that the thermal resistance between the power semiconductor device and any ambient structure, such as heat sinks or mounting substrates, may be calculated very accurately.

As it is possible to control the heat energy introduced into the power semiconductor device precisely by control of electrical parameters of the power semiconductor device only, it will further become possible to derive an estimation from the on-state resistance of the power semiconductor device on the basis of the accurately controllable junction temperature. Since the value of the on-state resistance of the power semiconductor device depends on the junction temperature within in the power semiconductor device, a precise determination of the on-state resistance will in turn enable a precise determination of the junction temperature.

The on-state resistance cannot be determined when the power semiconductor device is driven in Ohmic mode, i.e. in a triode operation regime where the feedback loop control of the gate-source voltage keeps the value of the drain-source voltage at a constant level higher than the difference between the current gate-source voltage and a device-specific threshold level for the gate-source voltage (the minimum positive voltage between gate and source above which the power semiconductor device transitions from its off-state into its on-state). Therefore, the on-state resistance needs to be determined during operation by intermittently driving the power semiconductor device entirely in its on-state, i.e. in the saturation region where the power semiconductor device is fully conducting by switching the gate-source voltage to a relatively high value. As the junction temperature has been stabilized before, the measurement of the drain-source voltage and drain current in the saturation region yields an estimation of the accurate junction temperature. The junction temperature directly correlates with the on-state resistance—such a correlation may for example be separately determined by heating the power semiconductor device externally without loading it and by determining the drain-source resistance when thermal equilibrium under external heating has been reached. Thus, the measurement of the drain-source voltage and drain current in the saturation region can be used for purposes of determination of the on-state resistance in this intermittent stage.

A particular advantage of the disclosure herein is that the determination of the thermal resistances and/or the junction temperatures relies entirely on the measurement of correspondingly selected thermo-sensitive electrical parameters (TSEPs) in a closed-loop control setup. Thus, there is no need for external temperature sensors or infrared cameras to be employed to determine temperatures within the device or module itself. This will in turn lead to a much more efficient characterization process for power semiconductor modules that are encapsulated in housings which would otherwise be difficult or impossible to access for purposes of external temperature measurements. Moreover, complicated, highly specific or expensive test equipment is not needed for measurement of the required TSEPs and other correlated device parameters.

The selection of the characterization and/or testing conditions may be made freely and can advantageously be adapted to the requirements of the measurement equipment. The methods and systems according to the various aspects of this disclosure may be particularly effective for power semiconductor devices based on standard silicon technology as well as gallium arsenide, gallium nitride or silicon carbide technology.

In some embodiments of the first aspect of the disclosure herein, the system may further comprise a gate-source voltage sensor coupled between the gate terminal and the source terminal, the gate-source voltage sensor being configured to measure a value of the gate-source voltage across the power semiconductor device.

In some embodiments of the first aspect of the disclosure herein, the system controller may be configured to measure the deviations of the gate-source voltage measured by the gate-source voltage sensor over time and to determine the thermal resistance of the power semiconductor device if the measured deviations of the gate-source voltage remain within a tolerance band for a predetermined amount of time. This may advantageously ensure that the determination of the thermal resistance may be made in thermal equilibrium, i.e. if the applied drain current induces a constant rate of heat losses in the power semiconductor device. Then the constant rate of heat losses is simply dependent on the product of the applied constant drain current and the sufficiently constant drain-source voltage.

In some embodiments of the first aspect of the disclosure herein, the gate controller may include a voltage source controller configured to output a gate voltage control signal to the adjustable gate voltage source. In several embodiments thereof, the gate controller may further include an adder configured to receive the drain-source voltage signal and the constant reference voltage from the system controller and to output the determined difference to the voltage source controller. In some implementations using analog circuitry elements, the voltage source controller and the adder may be implemented using operational amplifiers. For example, the voltage source controller may include an integration operational amplifier and the adder may include a differential operational amplifier.

In some embodiments of the first aspect of the disclosure herein, the system controller may be configured to measure the deviations of the drain-source voltage signal over time and to determine the thermal resistance of the power semiconductor device if the measured deviations of the drain-source voltage signal remain within a tolerance band for a predetermined amount of time. This may advantageously ensure that the determination of the thermal resistance may be made in thermal equilibrium, i.e. if the applied drain current induces a constant rate of heat losses in the power semiconductor device. Then the constant rate of heat losses is simply dependent on the product of the applied constant drain current and the sufficiently constant drain-source voltage.

In some embodiments of the second aspect of the disclosure herein, the method may further comprise the step of measuring deviations of the gate-source voltage and/or the drain-source voltage across the power semiconductor device over time. In some embodiments thereof, the thermal resistance of the power semiconductor device may then only be determined once the measured deviations of the gate-source voltage and/or the drain-source voltage remain under respective tolerance bands for a predetermined amount of time. This may advantageously ensure that the determination of the thermal resistance may be made in thermal equilibrium, i.e. if the applied drain current induces a constant rate of heat losses in the power semiconductor device. Then the constant rate of heat losses is simply dependent on the product of the applied constant drain current and the sufficiently constant drain-source voltage. The stability of the measured drain-source voltage directly or the measured gate-source voltage as proxy may serve as an indicator for the stability of the adjusted thermal equilibrium at the junctions within the power semiconductor device.

In some embodiments of the third aspect of the disclosure herein, the system may further comprise a gate-source voltage sensor coupled between the gate terminal and the source terminal, the gate-source voltage sensor being configured to measure a value of the gate-source voltage across the power semiconductor device.

In some embodiments of the third aspect of the disclosure herein, the system controller may be configured to measure the deviations of the gate-source voltage measured by the gate-source voltage sensor over time and to switch the power semiconductor device to its fully conducting state when the deviations in the measured values of the gate-source voltage over time remain within a tolerance band for a predetermined amount of time. This may advantageously ensure that the determination of the on-state resistance and consequently the junction temperature may be made in thermal equilibrium, i.e. if the applied drain current induces a constant rate of heat losses in the power semiconductor device. Then the constant rate of heat losses is simply dependent on the product of the applied constant drain current and the sufficiently constant drain-source voltage.

In some embodiments of the third aspect of the disclosure herein, the gate controller may include a voltage source controller configured to output a gate voltage control signal to the adjustable gate voltage source. In several embodiments thereof, the gate controller may further include an adder configured to receive the drain-source voltage signal and the constant reference voltage from the system controller and to output the determined difference to the voltage source controller. In some implementations using analog circuitry elements, the voltage source controller and the adder may be implemented using operational amplifiers. For example, the voltage source controller may include an integration operational amplifier and the adder may include a differential operational amplifier.

In some embodiments of the third aspect of the disclosure herein, the system controller may be configured to adjust the gate-source voltage and/or the constant drain current to different values in order to estimate different junction temperatures within the power semiconductor device for the adjusted values of the constant drain current and/or the adjusted values of the gate-source voltage. Similarly, in some embodiments of the fourth aspect of the disclosure herein, all the steps of the method according to the fourth aspect of the disclosure herein may be repeated in order to estimate the junction temperature within the power semiconductor device for a different value of the constant drain current and/or the gate-source voltage. These measures may advantageously aid in characterizing the power semiconductor module over a range of different values of the TSEPs as the junction temperatures can be determined as a function of gate-source voltage, drain current and drain-source voltage.

BRIEF DESCRIPTION OF THE DRAWINGS

Embodiments of this disclosure will now be described, by way of nonlimiting example, with reference to the accompanying drawings. The disclosure herein will be explained in greater detail with reference to example embodiments depicted in the drawings as appended.

The accompanying drawings are included to provide a further understanding of the disclosure herein and are incorporated in and constitute a part of this specification. The drawings illustrate the embodiments of the disclosure herein and together with the description serve to explain the principles of the disclosure herein. Other embodiments of the disclosure herein and many of the intended advantages of the disclosure herein will be readily appreciated as they become better understood by reference to the following detailed description. The elements of the drawings are not necessarily to scale relative to each other. Like reference numerals designate corresponding similar parts.

DETAILED DESCRIPTION

The following description of certain embodiments presents various descriptions of specific embodiments. Although specific embodiments have been illustrated and described herein, it will be appreciated by those of ordinary skill in the art that a variety of alternate and/or equivalent implementations may be substituted for the specific embodiments shown and described without departing from the scope of the disclosure herein. Generally, this application is intended to cover any adaptations or variations of the specific embodiments discussed herein. Moreover, it will be understood that certain embodiments can include more elements than illustrated in a drawing and/or a subset of the elements illustrated in a drawing. Further, some embodiments can incorporate any suitable combination of features from two or more drawings.

Figure 1:
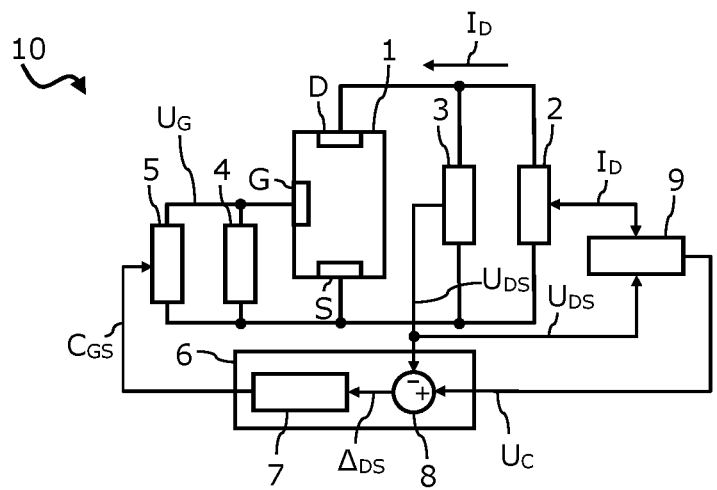
FIG. 1 illustrates an example circuit design of a system for determining the thermal resistance of a power semiconductor and for estimating junction temperatures of a housed power semiconductor module according to some embodiments of the disclosure herein.

FIG. 1 illustrates an example circuit design of a system 10 including a three-terminal power semiconductor device 1. The system 10 may in some configurations be used for determining the thermal resistance $R_{Th}$ of the power semiconductor device 1. The system 10 may in some other configurations also be used for estimating junction temperatures $T_J$ of the power semiconductor device 1 when it is included in a power semiconductor module.

Figure 2:
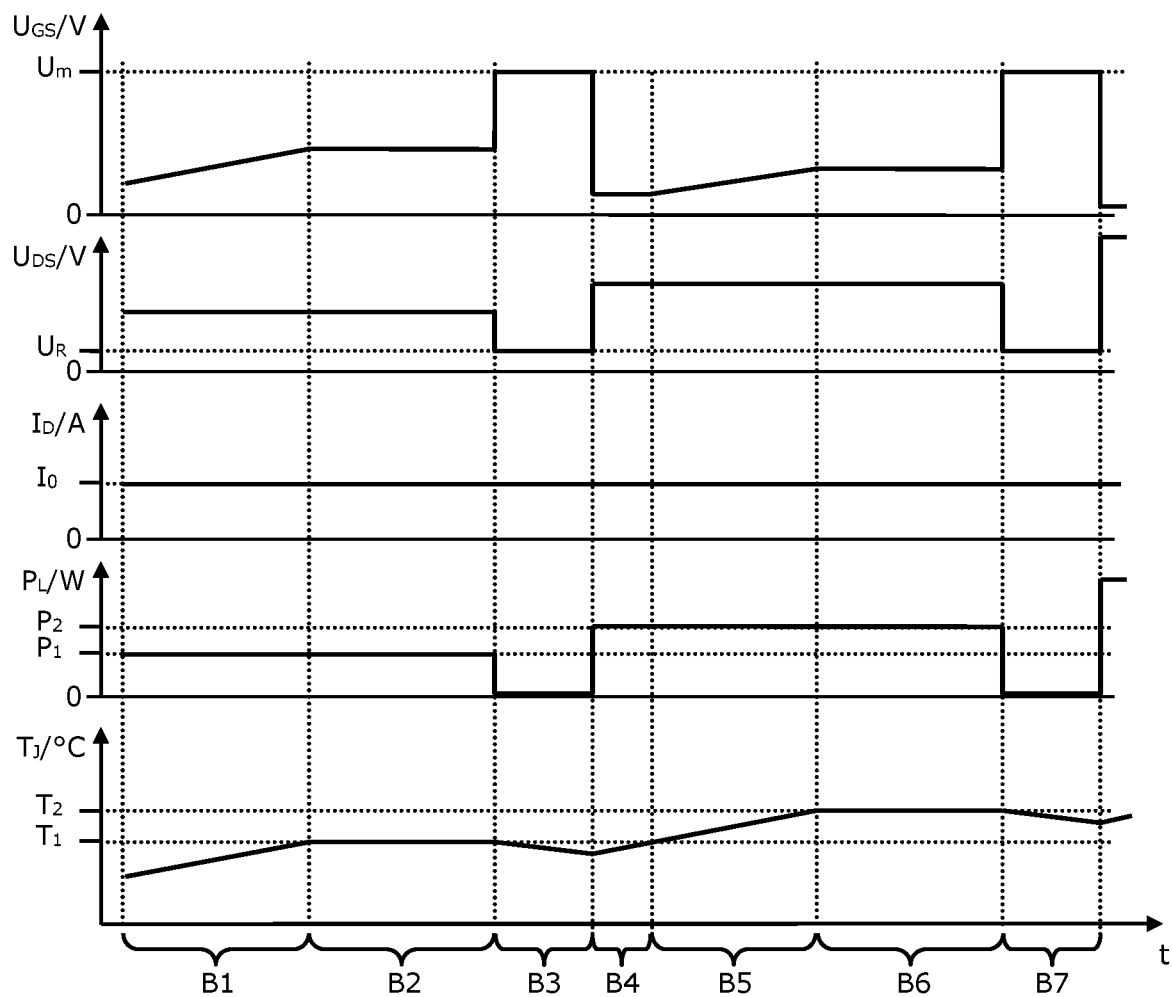
FIG. 2 illustrates example timing graphs of various characteristic parameters of a power semiconductor module that occur during a method for estimating junction temperatures of the same according to some embodiments of the disclosure herein.
Figure 3:
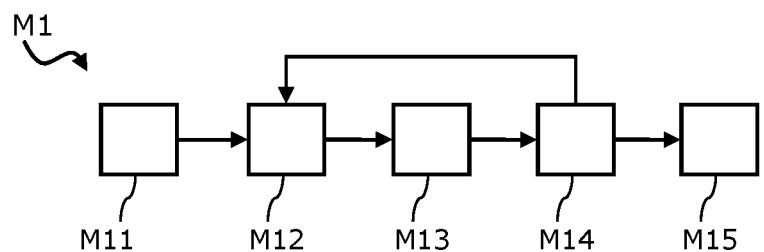
FIG. 3 depicts blocks of a flow diagram of a method for determining the thermal resistance of a power semiconductor according to some embodiments of the disclosure herein.
Figure 4:
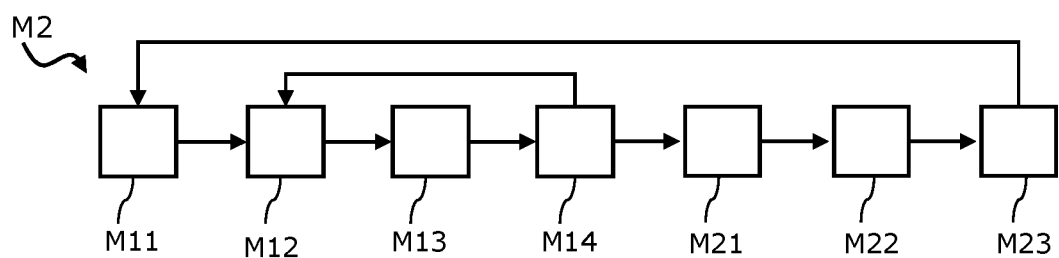
FIG. 4 depicts blocks of a flow diagram of a method for estimating junction temperatures of a power semiconductor module according to some embodiments of the disclosure herein.

The system 10 depicted in FIG. 1 may be used in methods for determining the thermal resistance of the power semiconductor device 1 and/or for methods estimating junction temperatures $T_J$ of the power semiconductor device 1 when it is included in a power semiconductor module, such as for example the methods M1 and/or M2 as exemplarily illustrated and explained in conjunction with FIGS. 3 and 4. During the execution of the method M2 of FIG. 4, the power semiconductor device 1 will undergo several stages of operations, the characteristic electrical and thermal parameters of which are exemplarily illustrated and explained in conjunction with FIG. 2.

The power semiconductor device 1, for example a metal-oxide semiconductor field-effect transistor (MOSFET), includes a drain terminal D, a gate terminal G and a source terminal S. A constant current source 2 is coupled between the drain terminal D and the source terminal S. The constant current source 2 is controlled to apply a drain current $I_D$ of constant adjustable value to the drain terminal D.

An adjustable gate voltage source 5 is coupled to the gate terminal G. A gate voltage signal $U_G$ can be applied to the gate terminal G, causing a gate-source voltage $U_{GS}$ to drop between the gate terminal G and the source terminal S. The gate source voltage $U_{GS}$ may for example be measured by a gate-source voltage sensor 4 that is coupled between the gate terminal G and the source terminal S.

A drain-source voltage sensor 3 is coupled between the drain terminal D and the source terminal S. The drain-source voltage sensor 3 can measure a value of the current drain-source voltage across the power semiconductor device 1. The drain-source voltage sensor 3 outputs a corresponding drain-source voltage signal indicating the respective drain-source voltage $U_{DS}$.

The drain-source voltage signal is output to a gate controller 6 that is in general configured to determine a difference $\Delta_{DS}$ between the drain-source voltage $U_{DS}$ and a constant reference voltage $U_C$ for the drain-source voltage $U_{DS}$. The constant reference voltage $U_C$ is the value that the drain-source voltage is to be stabilized on. The gate controller 6 includes an adder 8, for example a differential operational amplifier, that receives the drain-source voltage $U_{DS}$ and a constant reference voltage $U_C$ as input and outputs the difference $\Delta_{DS}$ between the drain-source voltage $U_{DS}$ and a constant reference voltage $U_C$.

The difference $\Delta_{DS}$ is routed to a voltage source controller 7 downstream of the adder 8 in the gate controller 6. The voltage source controller 7 produces a gate voltage control signal $C_{GS}$ that is output to the adjustable gate voltage source 5 for controlling the applied gate voltage signal $U_G$. As a rising gate-source voltage $U_{GS}$ will cause the drain-source voltage $U_{DS}$ to drop, any increase in the drain-source voltage $U_{DS}$ due to a rising junction temperature $T_J$ within the power semiconductor device 1 can be compensated for by a controlled decrease due to an increasing gate-source voltage $U_{GS}$. Thus, the difference $\Delta_{DS}$ serves as a control value for the control loop implemented between the drain-source voltage sensor 3 and the adjustable gate voltage source 5. If the difference $\Delta_{DS}$ is minimized, the drain-source voltage $U_{DS}$ may be kept at a sufficiently constant level.

A system controller 9 is coupled to the gate controller 6, the constant current source 2, the drain-source voltage sensor 3 and optionally to the gate-source voltage sensor 4. The system controller 9 is configured to set the value of the drain current $I_D$ to be applied to the drain terminal D of the power semiconductor device 1. The system controller 9 further receives the value of the drain-source voltage $U_{DS}$ and is able to calculate the thermal resistance $R_{Th}$ of the power semiconductor device 1 in dependency from, i.e. on the basis of the applied drain current $I_D$ and the measured drain-source voltage $U_{DS}$ as follows:

$$R_{Th} = \Delta T \cdot P_L^{-1} = \Delta T \cdot I_D^{-1} \cdot U_{DS}^{-1},$$

where $\Delta T$ is the temperature difference between the junction temperature $T_J$ and the ambient temperature $T_A$ due to which the power loss $P_L$ occurs.

One of the aims of the gate controller 6 is to adjust electrical parameters of the power semiconductor device 1 in a way that a defined amount of power losses at a constant loss rate within the power semiconductor device 1 may be established. The on-state resistance $R_{DSon}$ and thus the drain-source voltage $U_{DS}$ are dependent on the junction temperature $T_J$ within the power semiconductor device 1. Therefore, if a constant drain current $I_D$ is applied to the drain terminal D, the occurring heat losses within the power semiconductor device 1 will give rise to a rise of the junction temperature $T_J$.

The system controller 9 can wait with the determination until a thermal equilibrium has been established at the junctions within the power semiconductor device 1. To determine whether an equilibrium has been reached, the system controller 9 can measure the deviations of the gate-source voltage $U_{GS}$ measured by the gate-source voltage sensor 4 or, alternatively or additionally, the deviations of the drain-source voltage $U_{DS}$ over time. If the respectively measured deviations do not exceed a stability threshold for a predetermined amount of time the system controller 9 can assume that a sufficient thermal equilibrium has been established and that the calculation of the thermal resistance $R_{Th}$ is sufficiently accurate.

FIG. 3 shows a method M1 for determining the thermal resistance of a power semiconductor device 1. In a first step M11, a constant drain current $I_D$ is applied to a drain terminal D of the power semiconductor device 1. Then, a second step M12 involves applying a gate voltage signal $U_G$ to a gate terminal G of the power semiconductor device 1. The gate voltage signal $U_G$ causes a gate-source voltage $U_{GS}$ to drop over the power semiconductor device between the gate terminal G and the source terminal S. The gate-source voltage $U_{GS}$ will influence the value of the drain-source voltage $U_{DS}$ over the power semiconductor device 1.

This current value of the drain-source voltage across the power semiconductor device 1 is measured in a third step M13. The measured value of the drain-source voltage will differ from a constant reference voltage $U_C$ that may for example be given by a system controller such as the system controller 9 of FIG. 1. This difference $\Delta_{DS}$ between the current drain-source voltage and a constant reference voltage $U_C$ can be determined and will be used as feedback signal to control the gate voltage signal $U_G$ in order to minimize the determined difference $\Delta_{DS}$ in a fourth step M14. Steps M12 to M14 will be repeated until an equilibrium has been established, i.e. until the power loss rate over the power semiconductor device 1 is constant.

It may be possible to measure deviations of the gate-source voltage and/or the drain-source voltage $U_{DS}$ across the power semiconductor device 1 over time. When the measured deviations have remained under a stability threshold for a predetermined amount of time, the system controller 9 can determine that thermal equilibrium has been reached and that in a fifth step M15, the thermal resistance $R_{Th}$ of the power semiconductor device 1 may be determined, for example by calculating:

$$R_{Th} = \Delta T \cdot P_L^{-1} = \Delta T \cdot I_D^{-1} \cdot U_{DS}^{-1},$$

where $\Delta T$ is the temperature difference between the junction temperature $T_J$ and the ambient temperature $T_A$ due to which the power loss $P_L$ occurs.

The system 10 of FIG. 1 may be used to thermally characterize a housed power semiconductor module including one or more power semiconductor devices therein without having to open the housing or the encapsulation in order to gain access for purposes of thermal sensors or infrared cameras. FIG. 2 shows example timing graphs of various characteristic parameters of a power semiconductor module that occur during such procedures for thermally characterizing of a power semiconductor module. The thermal characterization process illustrated herein may be particularly useful for a housed power semiconductor module. The graphs qualitatively illustrate the temporal course of (from top to bottom) the gate-source voltage $U_{GS}$, the drain-source voltage $U_{DS}$, the drain current $I_D$, the power loss $P_L$ at the junctions of the power semiconductor device and the junction temperature $T_J$ of the power semiconductor device.

In a first stage B1, the drain current $I_D$ is a constant value $I_0$ and is applied by the system controller 9 so that power losses $P_L$ of a first amount $P_1$ occur in the power semiconductor device 1. These power losses will lead to an increasing junction temperature $T_J$. In order to combat the concomitant rise of the drain-source voltage $U_{DS}$ the closed-control feedback loop of the gate controller 6 will raise the gate-source voltage $U_{GS}$ in a controlled manner so that the drain-source voltage $U_{DS}$ will remain essentially constant.

This constant level of the drain-source voltage $U_{DS}$ will carry over to a second stage B2 in which the junction temperature $T_J$ has stabilized to a constant value $T_1$ and the gate-source voltage $U_{GS}$ does not need to be varied any more. The system controller 9 can determine if the deviations in the measured values of the drain-source voltage over time remain within a tolerance band, i.e. that the measured values of the drain-source voltage do not significantly change over time. Depending on the expected time for having the junction temperature $T_J$ settle on a stable value, the second stage B2 may last for a timespan predetermined by the system controller 9.

After the second stage B2, in which the power semiconductor device 1 is operated in Ohmic mode, the system controller 9 will cause the gate voltage source 5 to abruptly apply a higher value Um of the gate-source voltage $U_{GS}$ to the power semiconductor device 1 so that the power semiconductor device 1 is switched to its fully conducting state, i.e. is operating in the saturation region. In this third stage B3, the on-state resistance $R_{DSon}$ can be estimated from the constant drain current $I_D$ and the drain-source voltage $U_{DS}$ at the (now) constant level UR to which the drain-source voltage $U_{DS}$ will drop. The determined on-state resistance $R_{DSon}$ will allow for estimating the junction temperature $T_J$ within the power semiconductor device 1. The junction temperature $T_J$ directly correlates with the on-state resistance $R_{DSon}$—such a correlation may for example be separately determined by heating the power semiconductor device 1 externally without loading it and by determining the drain-source resistance when thermal equilibrium under external heating has been reached. Thus, the measurement of the drain-source voltage $U_{DS}$ and drain current $I_D$ in the third stage B3 can be used for purposes of determination of the on-state resistance $R_{DSon}$.

Of course, the junction temperature $T_J$ will drop slightly during the third stage B3 but if the measurements are done quickly enough this temperature drop will be insignificant in terms of accuracy of temperature estimation. It should be clear that the length of the third stage B3 may be significantly shorter than any of the previous stages B1 and B2 but has not been depicted to scale in order to better explain the process.

The entire process may now be repeated for different values of the constant drain current $I_D$ and/or the gate-source voltage $U_{GS}$ in order to obtain a characterization profile of the power semiconductor module. In the example depicted in FIG. 2 the fourth stage B4 will keep the drain current $I_D$ at the same level as before, but the gate-source voltage $U_{GS}$ is lowered to incite a higher level of the drain-source voltage $U_{DS}$ and, consequently, a higher level $P_2$ of power losses $P_L$. Then, the process will repeat fifth, sixth, and seventh stages B5, B6, and B7, respectively, which work analogously to the first, second, and third stages B1, B2, and B3, respectively, only for higher values of the drain-source voltage $U_{DS}$ and the junction temperature $T_J$ which will now rise to a stable temperature $T_2$ higher than the previous temperature $T_1$.

It should be clear that the gate-source voltage $U_{GS}$, the drain current $I_D$ and the drain-source voltage $U_{DS}$ may be adjusted to nearly arbitrary values in various combinations in subsequent stages of the characterization process depicted in FIG. 2 so that a thermal profile of a power semiconductor module may be established under various load conditions.

FIG. 4 illustrates a method M2 for estimating junction temperatures of a power semiconductor module. In a first step M11, a constant drain current is applied $I_D$ to a drain terminal D of a power semiconductor device 1 of the housed power semiconductor module. Then, in a second step M12, a gate voltage signal $U_G$ is applied to a gate terminal G of the power semiconductor device 1. The current drain-source voltage across the power semiconductor device 1 may be measured and a corresponding difference $\Delta_{DS}$ between the current drain-source voltage and a constant reference voltage $U_C$; can be determined in a third step M13.

The gate voltage signal $U_G$ may then be controlled in a fourth step M14 dependent on the determined difference $\Delta_{DS}$ in order to minimize the determined difference $\Delta_{DS}$. The steps M12, M13 and M14 are iterated in a closed-control feedback loop.

The deviations of the values of the gate-source voltage across the power semiconductor device 1 over time that are measured in a fifth step M21 may eventually remain within a tolerance band so that the power semiconductor device 1 may be abruptly switched in a sixth step M22 to its fully conducting state. In this fully conducting state, i.e. when the power semiconductor device is operating in saturation, the junction temperature $T_J$ within the power semiconductor device 1 may be estimated in a seventh step M23 on the basis of the on-state resistance $R_{DSon}$ of the power semiconductor device 1.

In the foregoing detailed description, various features are grouped together in one or more examples with the purpose of streamlining the disclosure. It is to be understood that the above description is intended to be illustrative, and not restrictive. It is intended to cover all alternatives, modifications and equivalents. Many other examples will be apparent to one skilled in the art upon reviewing the above specification.

The embodiments were chosen and described in order to best explain the principles of the disclosure herein and its practical applications, to thereby enable others skilled in the art to best utilize the disclosure herein and various embodiments with various modifications as are suited to the particular use contemplated. In the appended claims and throughout the specification, the terms "including" and "in which" are used as the plain-English equivalents of the respective terms "comprising" and "wherein," respectively. Furthermore, "a" or "one" does not exclude a plurality in the present case.

The subject matter disclosed herein can be implemented in association with software in combination with hardware and/or firmware. For example, the subject matter described herein can be implemented in software executed by a processor or processing unit. In one example implementation, the subject matter described herein can be implemented using a computer readable medium having stored thereon computer executable instructions that when executed by a processor of a computer control the computer to perform steps. Example computer readable mediums suitable for implementing the subject matter described herein include non-transitory devices, such as disk memory devices, chip memory devices, programmable logic devices, and application specific integrated circuits. In addition, a computer readable medium that implements the subject matter described herein can be located on a single device or computing platform or can be distributed across multiple devices or computing platforms.

While at least one example embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the example embodiment(s). In addition, in this disclosure, the terms "comprise" or "comprising" do not exclude other elements or steps, the terms "a", "an" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A system for estimating junction temperatures of a power semiconductor module, the system comprising:
a constant current source configured to apply a constant drain current to a drain terminal of a power semiconductor device of the power semiconductor module;
an adjustable gate voltage source configured to apply a gate voltage signal to a gate terminal of the power semiconductor device;
a drain-source voltage sensor coupled between the drain terminal and a source terminal, the drain-source voltage sensor being configured to measure a value of a drain-source voltage across the power semiconductor device and to output a corresponding drain-source voltage;
a gate controller configured to determine a difference between the drain-source voltage and a constant reference voltage and to control the gate voltage signal of the adjustable gate voltage source depending on the determined difference; and
a system controller configured to switch the power semiconductor device to a fully conducting state when deviations in the drain-source voltage over time remain within a tolerance band and to estimate a junction temperature within the power semiconductor device on a basis of an on-state resistance of the power semiconductor device in the fully conducting state.

2. The system of claim 1, wherein the system controller is configured to adjust the constant drain current to a different value and to estimate, for the different value of the constant drain current, the junction temperature within the power semiconductor device on the basis of the on-state resistance of the power semiconductor device in the fully conducting state.

3. The system of claim 1, wherein the system controller is configured to adjust the gate voltage signal to a different value and to estimate, for the different value of the gate voltage signal, the junction temperature within the power semiconductor device on the basis of the on-state resistance of the power semiconductor device in the fully conducting state.

4. The system of claim 1, further comprising a gate-source voltage sensor coupled between the gate terminal and the source terminal, the gate-source voltage sensor configured to measure a value of a gate-source voltage across the power semiconductor device.

5. The system of claim 4, wherein the system controller is configured to measure deviations of the gate-source voltage measured by the gate-source voltage sensor over time and to switch the power semiconductor device to the fully conducting state when the deviations in measured values of the gate-source voltage over time remain within a tolerance band for a predetermined amount of time.

6. The system of claim 1, wherein the gate controller comprises a voltage source controller configured to output a gate voltage control signal to the adjustable gate voltage source.

7. The system of claim 6, wherein the gate controller comprises an adder configured to receive the drain-source voltage and the constant reference voltage and to output the determined difference to the voltage source controller.

8. The system of claim 7, wherein the voltage source controller comprises an integration operational amplifier and the adder comprises a differential operational amplifier.

9. A method for estimating junction temperatures of a power semiconductor module, the method comprising:
applying a constant drain current to a drain terminal of a power semiconductor device of the power semiconductor module;
applying, using an adjustable gate voltage source, a gate voltage signal to a gate terminal of the power semiconductor device;
measuring, using a drain-source voltage sensor coupled between the drain terminal and a source terminal, a value of a drain-source voltage across the power semiconductor device;

determining, using a gate controller, a difference between the drain-source voltage and a constant reference voltage;

controlling, using the gate controller, the gate voltage signal of the adjustable gate voltage source depending on the determined difference to minimize the determined difference;

measuring deviations of values of the drain-source voltage across the power semiconductor device over time;

switching the power semiconductor device to a fully conducting state when the deviations in the measured values of the drain-source voltage over time remain within a tolerance band; and estimating a junction temperature within the power semiconductor device on a basis of an on-state resistance of the power semiconductor device in the fully conducting state.

10. The method of claim 9, comprising:

adjusting the constant drain current to a different value; and estimating, for the different value of the constant drain current, the junction temperature within the power semiconductor device on the basis of the on-state resistance of the power semiconductor device in the fully conducting state.

11. The method of claim 9, comprising:

adjusting the gate voltage signal to a different value; and estimating, for the different value of the gate voltage signal, the junction temperature within the power semiconductor device on the basis of the on-state resistance of the power semiconductor device in the fully conducting state.

12. The method of claim 9, comprising:

coupling a gate-source voltage sensor between the gate terminal and the source terminal; and measuring a value of a gate-source voltage across the power semiconductor device.

13. The method of claim 12, comprising:

measuring deviations of the gate-source voltage measured by the gate-source voltage sensor over time; and switching the power semiconductor device to the fully conducting state when the deviations in measured values of the gate-source voltage over time remain within a tolerance band for a predetermined amount of time.

14. The method of claim 9, wherein the gate controller comprises a voltage source controller, the method comprising outputting, from the voltage source controller, a gate voltage control signal to the adjustable gate voltage source.

15. The method of claim 14, wherein the gate controller comprises an adder, the method comprising:

receiving, at the adder, the drain-source voltage and the constant reference voltage; and outputting, from the adder, the determined difference to the voltage source controller.

16. The method of claim 15, wherein the voltage source controller comprises an integration operational amplifier and the adder comprises a differential operational amplifier.

* * * * *